United States Patent [19]

Esch

[11] 4,056,825

[45] Nov. 1, 1977

[54] FET DEVICE WITH REDUCED GATE OVERLAP CAPACITANCE OF SOURCE/DRAIN AND METHOD OF MANUFACTURE

[75] Inventor: Ronald Philip Esch, Manassas, Va.

[73] Assignee: International Business Machines Corporation, Armonk, N.Y.

[21] Appl. No.: 769,801

[22] Filed: Feb. 17, 1977

Related U.S. Application Data

[63] Continuation of Ser. No. 591,995, June 30, 1975, abandoned.

[51] Int. Cl.² .................... H01L 29/78; H01L 29/34; H01L 29/04
[52] U.S. Cl. ........................................ 357/23; 357/54; 357/59
[58] Field of Search .................... 357/23, 54, 59

[56] References Cited

U.S. PATENT DOCUMENTS

| | | | |
|---|---|---|---|
| 3,787,251 | 1/1974 | Brand et al. | 357/23 |
| 3,793,090 | 2/1974 | Barile et al. | 357/23 |
| 3,863,330 | 2/1975 | Kraybill et al. | 357/23 |
| 3,899,372 | 8/1975 | Esch | 357/23 |
| 3,909,306 | 9/1975 | Sakamoto et al. | 357/23 |
| 3,913,211 | 10/1975 | Seed et al. | 357/23 |
| 3,936,859 | 2/1976 | Dingwall | 357/23 |
| 3,958,323 | 5/1976 | DeLaMoneda | 357/54 |
| 4,015,281 | 3/1977 | Nagata et al. | 357/23 |
| 4,016,587 | 4/1977 | DeLaMoneda | 357/23 |

*Primary Examiner*—Andrew J. James
*Attorney, Agent, or Firm*—Joseph C. Redmond, Jr.; Maurice H. Klitzman

[57] ABSTRACT

A metal gate transistor is fabricated to have reduced gate overlap of source/drain regions and increased oxide thickness over the diffused regions whereby parasitic capacitance is reduced and switching speed is increased. The method comprises the steps of (1) selecting an appropriate insulating thickness over a semiconductor substrate, (2) forming source/drain diffused regions in the substrate through openings in the insulating layer at appropriate diffusion temperatures, (3) selecting an appropriate drivein and regrowth temperature whereby the insulating layer thickness over the diffused region is greater than that over the non-diffused region and out diffusion of the diffused regions is minimized, (4) etching the region between the source/drain to form a gate area and (5) growing a prescribed gate insulation thickness for a metal gate whereby the gate insulation overlap of the diffused region and the thickness of the gate insulation overlap of the diffused region reduce the parasitic capacitance and increase the switching speed of the resulting metal gate transistor relative to prior art transistors.

11 Claims, 14 Drawing Figures

PRIOR ART | NEW STRUCTURE

SOURCE DRAIN PATTERN
IN INITIAL OXIDE

POST SOURCE DRAIN
DRIVE-IN WITH
REOXIDATION

GATE PATTERN

POST GATE REOXIDATION

POST ALUMINUM SUBETCH

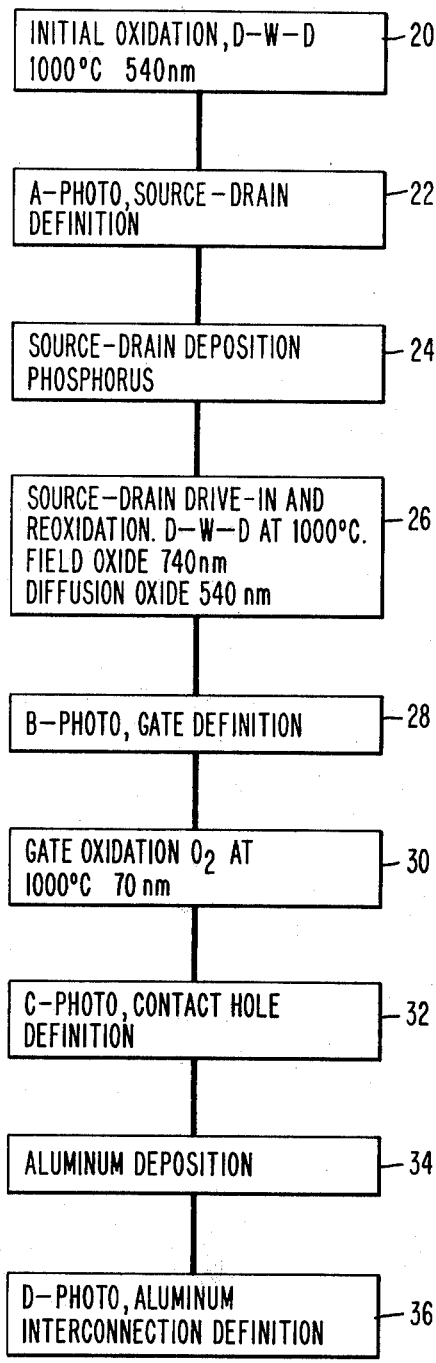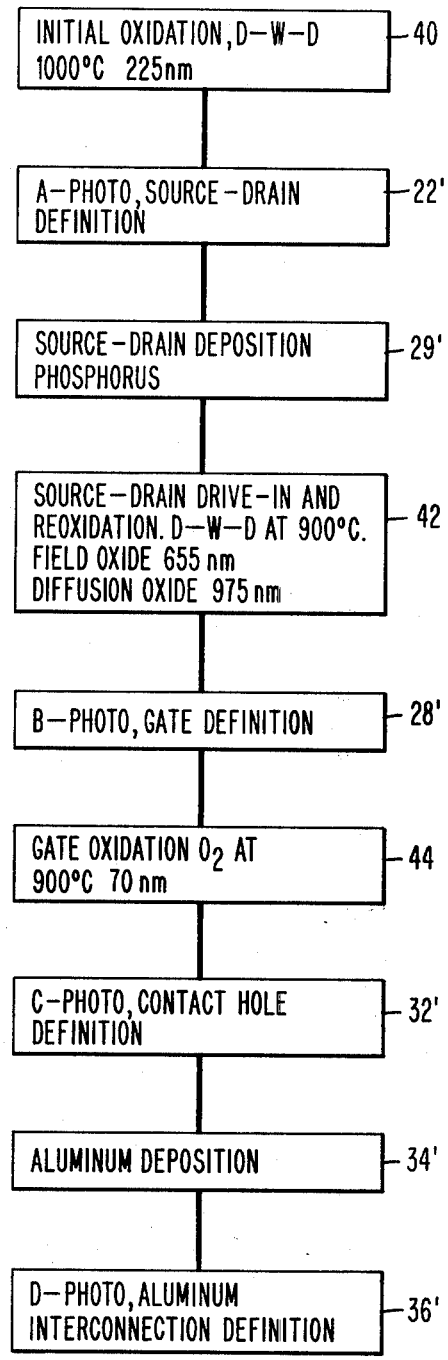
FIG. 2
FIG. 4

FET DEVICE WITH REDUCED GATE OVERLAP CAPACITANCE OF SOURCE/DRAIN AND METHOD OF MANUFACTURE

This is a continuation of application Ser. No. 591,995 filed June 30, 1975, now abandoned.

BACKGROUND OF THE INVENTION

A. Field of the Invention

The invention relates to semiconductor device and processes of manufacture. More particularly, the invention relates to field effect transistors having reduced parasitic capacitance and processes of manufacture therefor.

B. Description of the Prior Art

Parasitic capacitance exists in insulated gate field effect transistors where the gate electrode overlaps the source and drain diffusions. Circuit performance of such devices in terms of switching speed, rise and fall times is decreased relative to optimum performance. Normally, self aligned gate processes are employed to reduce the gate electrode overlap of the source and drain regions. In a self aligned gate process, the gate region is specified before the source/drain diffusions are performed. Self aligned processes remove the portion of the overlap region which is designed into conventional metal gate processes to compensate for the misregistration of the different mask levels. The small amount of residual overlap in self aligned processes is comparatively minor and does not significantly impact circuit performance. Self aligned gate processes, however, require polysilicon or silicon nitride or other materials to carry out the process. Etching of these materials is complicated and difficult to control resulting in lower yields for self aligned processes than for metal gate processes.

A metal gate process that reduces overlap capacitance and does not introduce new process steps, materials or etchants in metal gate process will significantly contribute to improve insulated gate filed effect transistors. One solution to achieve this result is to increase the insulation thickness over the source/drain regions and minimize the length of the gate overlap. Insulation thickness over the diffused regions can be maximized relative to the undiffused region due to the differential oxidation rates there between. In a previously filed application, Ser. No. 411,518 filed Oct. 31, 1973, now U.S. Pat. No. 3,899,372 issued Aug. 12, 1975 assigned to the present assignee, the differential oxidation rates of these regions are utilized to achieve a substantially planar insulating level for a metal gate transistor. Adopting the principals of the previously filed application, a metal gate process can be realized which increases diffused insulation thickness and reduces gate overlap.

An object of the present invention is a semiconductor device having improved performance by reduced parasitic capacitance.

Another object is a field effect transistor having reduced gate overlap capacitance and a substantially planar field and diffusion insulating layers.

Another object of the invention is a field effect transistor having reduced overlap capacitance.

Another object of the invention is a field effect transistor having increased gate overlap insulating thickness.

Another object of the invention is a process of fabricating a semiconductor device having reduced parasitic capacitance.

Another object of the invention is a process of fabricating a field effect transistor that is compatible with conventional metal gate processes to achieve increased gate overlap insulating thickness and reduced length of gate overlap of the diffused regions.

SUMMARY OF THE INVENTION

In an illustrative embodiment a reduction in overlap capacitance is obtained by (1) proper selection of initial insulating layer thickness, (2) judicious choice of diffusion flow rates and temperatures, and (3) the proper choice of insulating regrowth temperature.

An initial insulating thickness, typically 225 to 300 nanometers (nm) of silicon dioxide, is formed on a silicon substrate by a dry-wet growth process. Source and drain openings are appropriately formed in the insulating layer by conventional photolithographic-etching processes commonly employed in metal gate transistor processes. For P type semiconductor substrates, a phosphorus deposition is formed through the openings in the insulating layer and onto the semiconductor substrate at a temperature of about 900° C for about 35 minutes. The phosphorus is driven into the semiconductor substrate to form N type source/drain regions at a temperature of 900°–950° C 160 to 270 minutes in the presence of steam. Under these conditions a differential insulating growth occurs over the diffused regions and the non-diffused regions of the semiconductor substrate. Typically, the diffused insulating layer thickness is of the order of 780 nm whereas the insulating thickness over the non-diffused or field region is of the order of 550 nm. Removal of the field insulating layer between the source 4s and drain 4d regions to form a gate area is achieved by conventional photolithographic etching processes. Etching of the field region to expose the semiconductor substrate leaves 230 nm of insulating layer thickness convering the diffused regions. The ratio of diffusion overlap to gate oxide thickness is increased about three times with a corresponding reduction in parasitic capacitance relative to prior art devices. Gate electrode and source/drain terminals are formed for the device by appropriate metallization and photolithographic-etching processes.

A feature of the invention is an insulated metal gate field effect transistor having shallow source/drain diffusions and improved diffusion-gate insulating layer overlap thickness.

Another feature is an insulated metal gate field effect transistor with a diffused insulating thickness that minimizes gate overlap length thereof.

Another feature is an improved process for fabricating insulating metal gate transistors by maximizing insulating layer growth over diffused regions.

Another featuer is an improved process for fabricating field effect transistors by selecting (1) an initial insulating thickness and (2) a regrowth temperature to achieve a relatively thick insulating layer growth over the overlap region between gate and source/drain regions.

BRIEF DESCRIPTION OF THE DRAWING

The invention and its further objects and features will be more fully understood from the following detailed description taken in conjunction with the drawing in which:

FIG. 2 shows the prior art process for fabricating the device of FIGS. 1A through 1E.

FIG. 4 shows the process steps in fabricating the device of the present invention in FIGS. 3A through 3E.

It will be understood that although the following processes are described in terms of a single element, the steps of the process may be performed upon an entire wafer which subsequently is divided into several hundred single elements.

DESCRIPTION OF THE PREFERRED EMBODIMENT

Figure 1A:
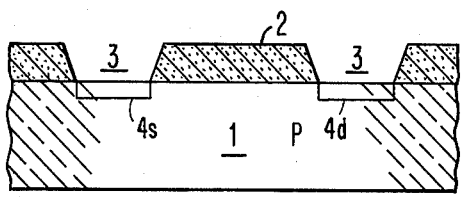
FIGS. 1A through 1E show cross sections of an insulated metal gate transistor being fabricated by a prior art process.

The prior art devices will be described in conjunction with FIGS. 1A through 1E and FIG. 2. FIG. 1A shows a beginning step in the process of fabricating an insulated metal gate transistor. A semiconductor substrate 1 typically silicon is covered by an insulating layer 2 of silicon dioxide. The oxide is formed by a dry-wet-dry process step 20 conducted at a temperature of 1000° C to achieve a thickness of 540nm. Openings 3 are formed in the oxide by well known photolithographic-etching processes in an operation 22 to form source and drain areas.

Figure 1B:
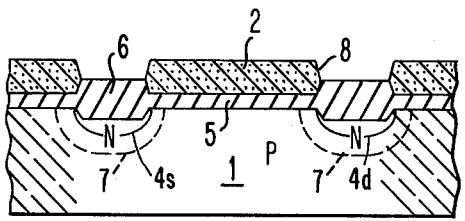

FIG. 1B shows the device after the diffusion of source/drain regions 7 and the regrowth of the oxide layer 5 beneath the original layer 2 and the regrowth layer 6 over the diffusion openings. The phosphorus deposition is made by conventional procedures in an operation 24. The deposited phosphorus is driven in with simultaneous reoxidation recurring in an operation 26. Reoxidation is achieved by a dry-wet-dry steam process at 1000° C for 10, 60, and 10 minutes, respectively. The oxide thickness over the diffused region is of the order of 540 nm. The oxide thickness over the non-diffused or field region is of the order of 740 nm.

Figure 1C:
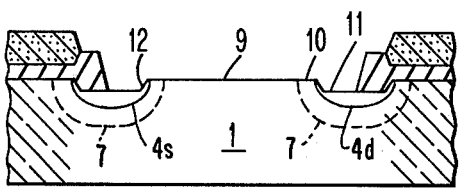

FIG. 1C shows the prior art device after etching to form a gate pattern area 9. The gate pattern definition is performed by a process step 28 which employs conventional photolithographic-etching processes to remove the field oxide between the source and drain regions. To compensate for mask alignment in the photolithographic process a tolerance associated with the masking process removes a portion of the oxide 6 over the diffused region 11 and 12 and the out-diffusion region 10.

Figure 1D:
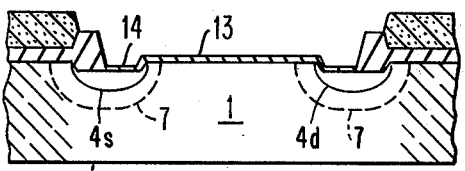

FIG. 1D shows the gate insulation growth 13 which covers the exposed diffused regions 11 and 12 (see FIG. 1C). The gate region 9 is also covered. The gate insulation growth 13 does not substantially increase the field oxidation 2 and 5, respectively. The gate oxidation is achieved by an operation 30 which employs dry oxygen at 1000° C to achieve the gate insulation thickness of 70 nm over the exposed substrate while growing 90 nm over the exposed diffused region, as shown in FIG. 1D. The gate insulation-diffusion overlap 14 is shown in more detail in FIG. 5A, to be described hereinafter.

Figure 1E:
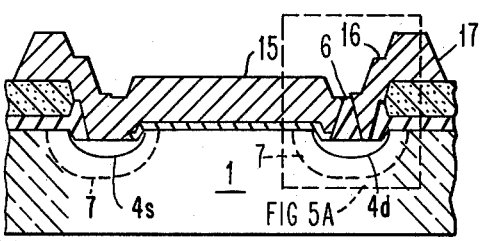

FIG. 1E shows the prior art device after forming gate electrode 15, terminals 16 and conductors 17. Operation 32 employs well known photlithographic-etching processes to form openings in the oxide layer 6 overlying the diffused region 7. An operation 34 deposits aluminum across the surface of the wafer prior to forming the electrodes 15, terminals 16 and conductor 17. The aluminum is deposited by well known metallic deposition processes to a thickness of approximately 1.0 micrometer. An operation 36 employs conventional photolithographic-etching processes to define (1) the gate electrode 15, (2) terminals 16 and (3) the conductor 17 with a connection to the terminals 16. A parasitic capacitor is formed by the gate electrode 15 overlying and separated from the diffused region 7 by the gate dielectric which has a thickness of the order of 70 nm. Laboratory experience indicates parasitic capacitance of the prior art devices is of the order of 0.039 picofarads per mil of gate width along one side.

Figure 3A:
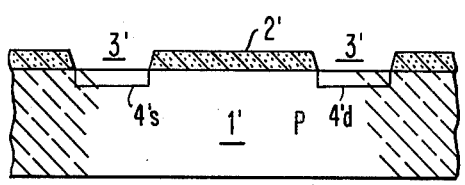
FIGS. 3A through 3E shows the cross sections of a device of the present invention being fabricated.
Figure 3B:
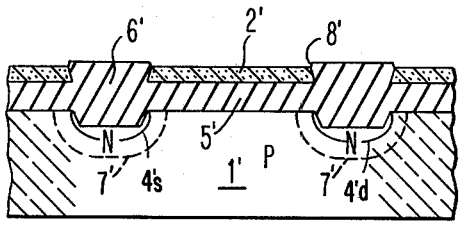

The structure and process of the present invention will be described in conjunction with FIGS. 3A through 3E and FIG. 4. Elements in FIGS. 3A through 3E corresponding to those in the prior art device will have corresponding but primed reference characters. FIG. 3A shows a substrate 1' having an insulating layer 2' with opening 3' therein formed by the process of 40 wherein an initial oxidation is performed by a dry-wet-dry steam process at 1000° C for 15, 25, and 30 minutes, respectively, to achieve a layer thickness of the order of 225 nm. The selection of the initial insulating layer thickness 2' is significant to achieving the objectives of the invention. The initial thickness determines the final thickness of the insulating overlying the field region. An initial thickness that is less than 225 nm may not be sufficiently dense enough to serve as a mask during the subsequent phorphorus deposition. Alternatively, an initial insulating thickness that is greater than 225 nm may increase the gate-diffused overlap capacitance, as in the manner of the prior art, previously described. A preferred range for the initial insulating thickness 2' is of the order of 200 to 300 nm. The openings 3' in FIG. 3A are performed by a photolithographic-etching process similar to that outlined for the prior art device in the process step 22. The diffusions 4's, 4d and 7' formed in FIG. 3B are formed by an initial phosphorus diffusion 29', as outlined in conjunction with FIG. 4 and a drive-in oxidation step 42. The drive-in and reoxidation step 42 is a dry-wet-dry steam process at 900° C for 5, 207, and 5 minutes, respectively. The field oxide 2 + 5 achieves a thickness of 655 nm. The diffused oxide 6' achieves a thickness of 975 nm. The difference in thickness is due to the different oxide growth rates on diffused and non-diffused semiconductor surfaces, as described in the previously filed application Ser. No. 411,518, filed Oct. 31, 1973. Additionally, the junction depth for the diffused region is much shallower than that for the prior art structure due to the lower drive-in temperature. Further details on the shallower diffused region will be given in conjunction with FIGS. 5A and 5B.

Figure 3C:
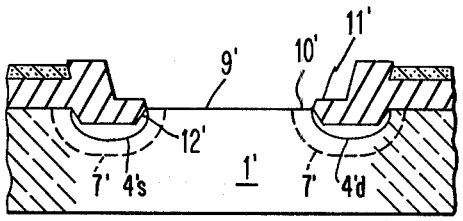

The gate region 9' as shown in FIG. 3C is achieved by a conventional photolithographic and etching process 28'. The mask tolerance area 11' and 12' is now covered by an oxide layer. Etching of the gate region is terminated when the field oxide is removed. Since the field oxide is of lesser thickness than the diffused oxide, a portion of the oxide remains over the diffused region. Laboratory experience indicates that only the out-diffused region 10' of the diffused area is not covered by an oxide.

Figure 3D:
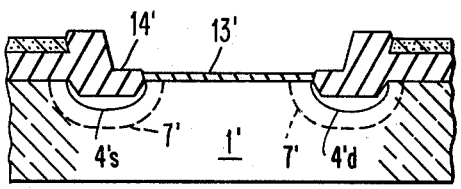
Figure 3E:
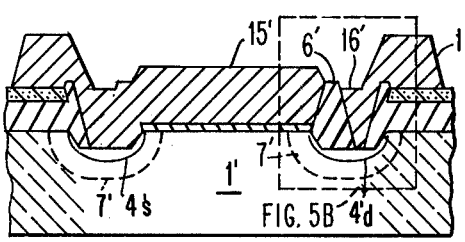

A gate oxidation step is performed at 900° C to achieve a thickness of 70 nm over the exposed out-diffused 10' and field regions 9', as shown in FIG. 3D. Further details of the gate diffused region overlap dimensions and the associated junction depth will be described in conjunction with FIGS. 5A and 5B. Metallization 15', terminals 16' and conductor 17' are formed on the device, as shown in FIG. 3E by the process steps 32', 34' and 36' outlined in conjunction with the prior art device.

Figure 5A:
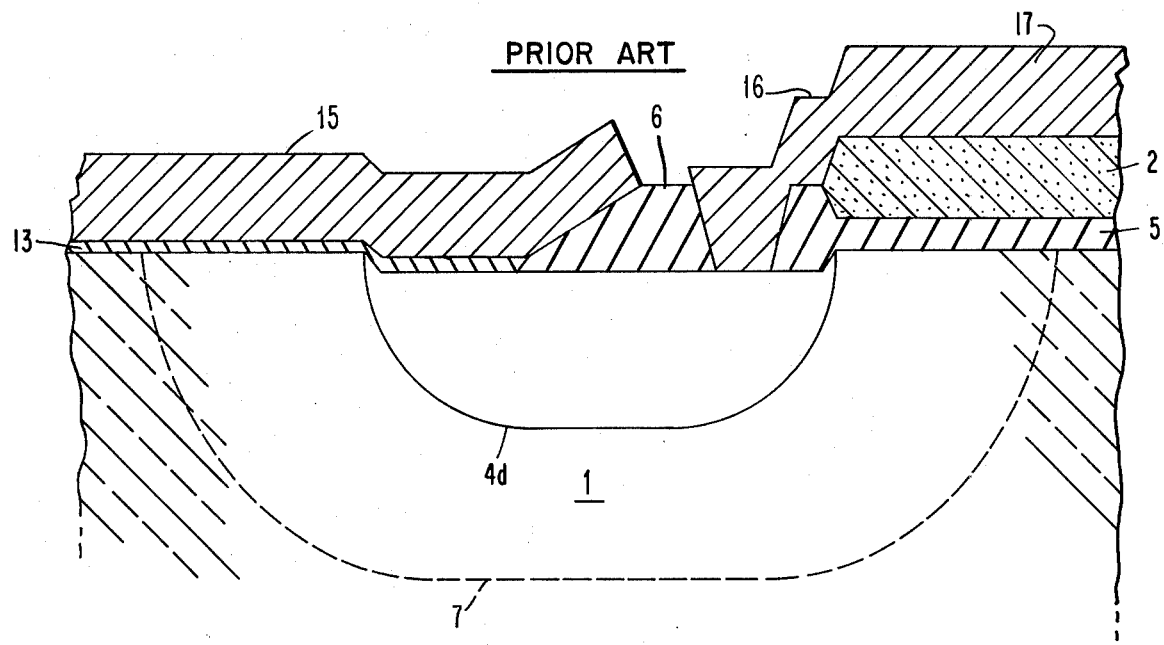
FIG. 5A shows a cross section of the gate-diffused overlap region of the prior art device of FIGS. 1A through 1E.

The differences in gate-diffusion overlap on the prior art device and the present structure will be described in conjunction with FIGS. 5A and 5B. Laboratory experience indicates the device of FIG. 5A has a gate overlap (A) of the diffused plus out-diffused regions of approximately 2.6 micrometers ($\mu$m). A portion or 1.6 micrometers of the gate oxidation is at 70 nm over the out-diffused region (B) and the remaining portion at 90 mn. The total gate overlap of the diffused region is equivalent to 2.38 micrometers of 70 nm oxide. The junction depth of the prior art device is of the order of 2 micrometers at the 1000° C drive-in temperature. As noted before, the parasitic capacitance associated with the device in FIG. 5A is 0.039 picofarads per mil along one side of the gate dimension over the diffused region.

Figure 5B:
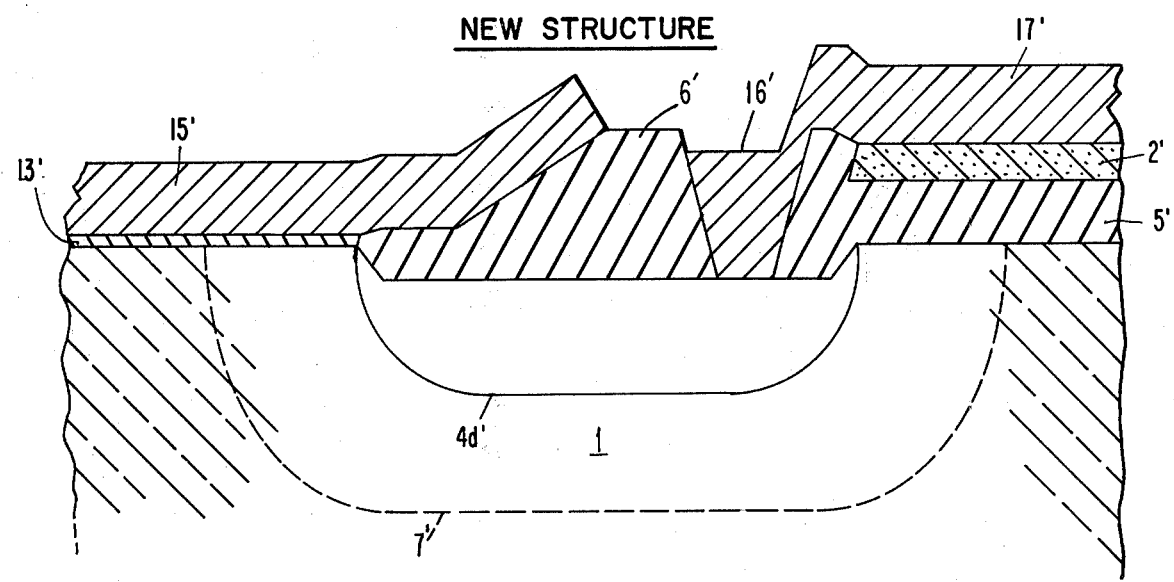
FIG. 5B shows the gate-diffused overlap region of the device of the present invention shown in FIGS. 3A through 3E.

The device of the present invention, in contrast, as shown in FIG. 5B, has a gate overlap of the out-diffused region of 1.0 micrometer of 70 nanometer oxide. There is in addition 0.7 micrometer of overlap of the 320 nm oxide over the diffused area giving an equivalent total overlap of 1.15 micrometers of 70 nm oxide. The junction depth for the device of FIG. 5B is 1.5 micrometers which lowers the out-diffused portion of the diffused region region from 1.6 micrometers as shown in FIG. 5A, to 1.0 micrometers, as shown in FIG. 5B. The increased gate oxide thickness overlapping the diffused region and the reduced out-diffusion of the device of FIG. 5B lowers the parasitic capacitance to approximately 0.019 picrofarads per mil along one side of the gate covering the diffused region. Switching speeds of the device of FIG. 5B have been found to increase from about 40 nanoseconds (device of FIG. 5A) to 32 nanoseconds.

Additional process examples will now be described to provide gate overlap and thickness dimensions for alternative circuit objectives.

EXAMPLE 2

A 225 nm initial oxide is formed by conventional dry-wet-dry process described in operation 40. After the formation of openings in the initial film, a regrowth oxide is formed by a dry-wet-dry process at 5, 205, and 5 minutes at 900° C temperature. The regrowth process results in 870 nm of oxide over the diffused region and 570 nm of oxide over the field region. After gate etching an oxide thickness of approximately 300 nm remains over the diffused region. The gate overlap is of the order of 1.7$\mu$m. The differential thickness between the unetched portion of the diffused oxide and the field oxide is of the order of 85nm.

EXAMPLE 3

A 300 nm initial oxide is formed on the substrate by the processes described in operation 20. After formation of openings and diffusion regions, a reoxidation is performed using a dry-wet-dry process for 5, 225, and 5 minutes, respectively. A diffusion oxide of 890 nm and a field oxide of 640 nm results from the regrowth process. After gate etching, a diffused oxide thickness of 250 nm remains. The gate overlap is of the order of 1.7$\mu$m. The differential thickness between the unetched diffused oxide and the field oxide is of the order of 19 nm and not 85 nm, as described in Example 2.

EXAMPLE 4

This process achieves a substantially planar field and diffused insulating layer after reoxidation with minimum gate overlap and maximum gate insulation thickness over the diffused region. An initial oxide film of 300 nm is formed on the substrate by conventional processes, as described in operation 40. After formation of source/drain openings and diffused regions a reoxidation is performed using a dry-wet-dry process for 5, 160, and 5 minutes, respectively at 900° C. The reoxidation process results in 775 nm of diffusion oxide and 555 nm field oxide. After gate etching, the diffused oxide thickness is of the order of 220 nm. The gate overlap is of the order of 1.7$\mu$m. The differential thickness between the unetched diffusion oxide and the field oxide is substantially 0.

The diffused regions may be formed by using N diffusants other than phosphorus. For example, substituing an arsenic diffusant for the phosphorus diffusant lessens the diffusant depth to the order of 0.8$\mu$m. The out-diffused region is correspondingly reduced during regrowth which reduces the gate overlap of the diffused region to the order of 1.3 micrometers.

The gate overlap capacitance of the diffused region may be further reduced by removing the insulating layer 2' between the diffused regions prior to reoxidation. Regrowth of the insulating layer between the diffused regions and over the diffused regions proceeds at differential rates, the oxide thickness over the diffused region being significantly greater than that between the diffused regions. Typically, the difference is of the order of 500 nm. The greater oxide thickness over the diffused region prevents or lessens exposure of the diffused region during the gate etching and reoxidation described in FIGS. 3C and 3D. Gate overlap has been found to be of the order of 1.3 $\mu$m by the process of removing the insulating layer between the diffused regions prior to reoxidation.

While the invention has been described employing P type substrates, it is also applicable to N type substrates. The boron reoxidation temperature when N type substrates are employed, however, should be performed below 1100° C, the precise temperature adjusted to achieve the desired differential oxide growth on the diffused area relative to the field area.

The invention has application to the formation of semiconductor capacitors. Leakage capacitance of such devices may be reduced by utilizing the differential growth process to maximize the insulation thickness over the diffused region and particularly at the external periphery of the capacitor where leakage is the most troublesome. The invention also has application in minimizing distributed capacitance associated with wiring nets overlying various diffused regions.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A semiconductor device having reduced parasitic capacitance comprising
   a. a semiconductor substrate of a first conductivity type, b. a first insulating layer including an opening disposed on the substrate, c. at least one diffused region of a second conductivity type disposed in the substrate and beneath the opening in the layer, d. a second insulating layer disposed on the first insulating layer and in the opening, the second layer in the opening having a thicker dimension than the first insulating layer, e. a third insulating layer disposed on the substrate adjacent to but not extending over the diffused region, and f. a conductor overlying the third insulating layer and at least a portion of the second layer, the parasitic capacitance related to the conductor overlap of the second and third layers being less than 0.039 picofarads per mil along one side of the conductor dimension over the diffused region.

2. The semiconductor device defined in claim 1 wherein the diffused region includes an outdiffused portion and the third layer extends over the outdiffused region in the range of 0.6 to 1.2 $\mu$m.

3. The semiconductor device defined in claim 1 wherein the second layer thickness over the diffused region is in the range of 180 to 975 nm.

4. The semiconductor device defined in claim 1 wherein the first insulating thickness is in the range of 200 to 300 nm.

5. The semiconductor device defined in claim 4 wherein the substrate is silicon and the insulating layers are silicon dioxide.

6. A metal gate field effect transistor having reduced parasitic capacitance comprising a. a semiconductor substrate of a first conductivity type, b. a first insulating layer including at least two openings disposed on the substrate, c. at least two diffused regions of a second conductivity type disposed in the substrate and beneath the openings in the layer, d. a insulating layer disposed on the first insulating layer and in the opening, the second layer in the opening having a thickness greater than the combined thickness of the second layer outside the opening and the first insulating layer, e. a third insulating layer disposed on the substrate and between the diffused regions but not extending over the diffused regions, f. a control electrode disposed on the third layer and at least a portion of the second layer, the parasitic capacitance of the gate overlap of the second layer being substantially reduced by the increased thickness of the second layer relative to the third insulating layer, and g. terminals connected to the diffused regions.

7. The semiconductor device of claim 6 wherein the diffused regions include an outdiffused portion and the third layer extends over the outdiffused region in the range of 0.6 to 1.2 $\mu$m.

8. The semiconductor device of claim 7 wherein the thickness of the second layer over the diffused region and beneath the control electrode is in the range of 180 to 975 nm.

9. The semiconductor device of claim 8 wherein the substrate is silicon and the insulating layers are silicon dioxide.

10. A semiconductor device having reduced parasitic capacitance comprising a. a semiconductor substrate of a first conductivity type, b. at least one diffused region of a second conductivity type including an outdiffused portion disposed in the substrate, c. a first insulating layer disposed on the substrate and surrounding a portion of the diffused region, d. a second insulating layer over the diffused region having a thickness greater than the first layer, a third thin insulating layer disposed on the substrate and extending over the outdiffused region but not the diffused region, and e. a conductor disposed on the second and third insulator layers and overlying the outdiffused region and at least a portion of the diffused region whereby the parasitic capacitance due to the conductor overlap of the diffused region is less than the parasitic capacitance due to the conductor overlap of the outdiffused region.

11. A metal gate FET device having reduced gate overlap capacitance of source and drain comprising a. a semiconductor substrate of a first conductivity type, b. at least two spaced diffused regions of a second conductivity type disposed in the substrate as source and drain, a first insulating layer disposed on the substrate and surrounding the spaced diffused regions, each diffused region including an outdiffused portion, c. a second insulating layer disposed on the diffused regions, d. a third insulating layer disposed on the substrate between the diffused regions and extending over the outdiffused portion but not the diffused regions, and f. a conductor disposed on the third insulating layer extending over at least a portion of the second insulating layer whereby the gate to source and drain overlap capacitance is substantially less than 0.039 picofarads per mil along one side of the gate dimensions over the diffused region.

* * * * *